(12) United States Patent
Chang

(10) Patent No.: US 6,759,318 B1
(45) Date of Patent: Jul. 6, 2004

(54) TRANSLATION PAD FLIP CHIP (TPFC) METHOD FOR IMPROVING MICRO BUMP PITCH IC SUBSTRATE STRUCTURE AND MANUFACTURING PROCESS

(75) Inventor: Chien-Wei Chang, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 0 days.

(21) Appl. No.: 10/414,597

(22) Filed: Apr. 15, 2003

(51) Int. Cl.$^7$ ................................................ H01L 21/44
(52) U.S. Cl. ...................... 438/612; 438/614; 438/622; 438/623; 438/637
(58) Field of Search ................................ 438/612, 613, 438/614, 618, 622, 623, 637, 642, 652, 666, 667, 672, 675, 106, 108

(56) References Cited

U.S. PATENT DOCUMENTS 5,826,330 A * 10/1998 Isoda et al. .................... 29/852
6,353,999 B1 * 3/2002 Cheng .......................... 29/852
6,518,513 B1 * 2/2003 Enomoto et al. ............ 174/262
6,531,661 B2 * 3/2003 Uchikawa et al. .......... 174/255
2001/0042637 A1 * 11/2001 Hirose et al. ............... 174/255

* cited by examiner

Primary Examiner—Kevin M. Picardat

(57) ABSTRACT

A method for a manufacturing process of micro bump pitch IC substrates uses a dielectric layer to replace the conventional solder resist, then uses CCD high precision alignment laser drill to open up the defined bump pad lands, and fills them with via plating filled metal accompanied by etching to enlarge the bump pads, and finally plates the bum pads with Sn/Pb. This can simultaneously solve the problems of insufficient strength of bump pads, limitation of printing technology and being unable to apply the solder in the conventional technologies. The method can provide a higher packaging density, higher yield rate, and provides a total solution to the next generation high density IC design.

4 Claims, 5 Drawing Sheets

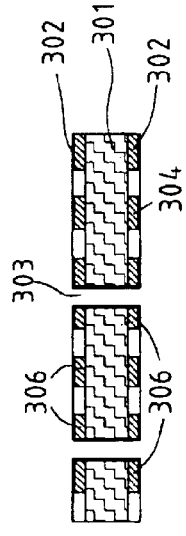
FIG. 3A
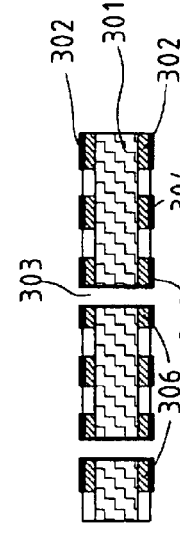
FIG. 3B
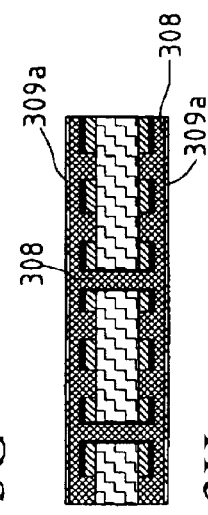
FIG. 3C
FIG. 3D
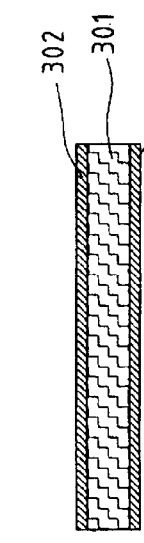
FIG. 3E
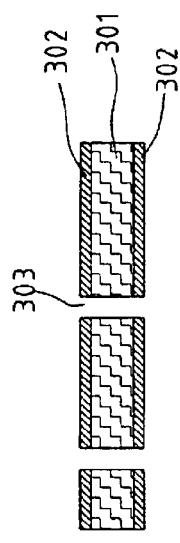
FIG. 3F
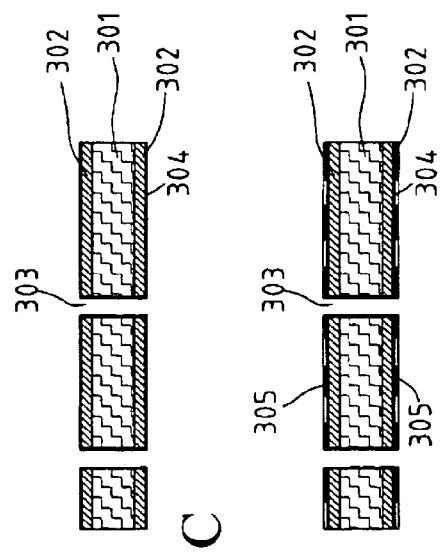
FIG. 3G
FIG. 3H 025
TRANSLATION PAD FLIP CHIP (TPFC) METHOD FOR IMPROVING MICRO BUMP PITCH IC SUBSTRATE STRUCTURE AND MANUFACTURING PROCESS

FIELD OF THE INVENTION

The invention relates to a method used in Translation Pad Flip Chip (TPFC) IC substrate manufacturing process, and more particularly to a method used in manufacturing micro bump pitch IC substrates.

BACKGROUND OF THE INVENTION

Recent product developments within the electronic industry are able to integrate more functions in a single substrate, which has led to a rapid increase in the number of I/Os used in a substrate, and a higher demand on packaging technology. With the Flip Chip (FC) technology currently used in the high level products, a higher packaging density is achieved, for example, the bump pitch between IC bumps can be reduced from 300 um to 200 um with the improvement of the alignment precision during the manufacturing process. However, with the next generation products that demand a packaging technology to reduce the bump pitch below 150 um, the conventional substrate structure and manufacturing methods can no longer meet such a demand. Therefore, the development of new substrate structure and manufacturing methods is imperative.

The conventional structure of IC substrates is a 4 to 10 layers of multi-layer printed circuit board, which is made of ceramics or organic materials. The conductive circuits between the layers are micro vias, mechanical or laser drilled, and wired to form bump pads for connecting IC bumps. Solder resist is used to define bump pad lands, and solders are applied by stencil printing. Conventionally, there are two ways to define the bump pad lands. The first is use solder resist to define the lands, as shown in FIG. 1, and the other is called metal defined lands, as shown in FIG. 2. When the bump pitch between IC bumps is reduced to below 150 um, the line between the bump pads will decrease the area of bump pad lands, which may cause solder paste unable to enter and fill solder mask opening where the grain size of the solder 102 is too large to be applied into the bump pad 101. This is problematic as the bonding strength is not sufficient to hold the IC chips, due to the lack of sufficient solder applied, as shown in FIG. 1. On the other hand, when when the solder resist 201, 202 covers less than 75 um in width, the solder resist 202 usually will not stick and is prone to peel off, as shown in FIG. 2. Hence, conventional methods are unable to manufacture micro bump pitch substrates.

SUMMARY OF THE INVENTION

The present invention provides a method to improve micro bump pitch IC substrates manufacturing process. It uses a dielectric layer to replace the conventional solder resist, then uses CCD high precision alignment laser drill to open up the defined bump pad lands, fills them with via plating filled metal accompanied by etching to enlarge the bump pads, and finally surface finishing the bump pads with various materials, such as solder, Ni/Au, or organic coating. This can simultaneously solve the problems of insufficient strength of bump pads, limitation of printing technology and being unable to apply the solder in the conventional technologies. Furthermore, the present invention can also translate the bump pads, passive component pads (e.g., capacitor pads), fiducial marks to the surface level, and avoid burying the pads in the solder resist that occurs in the conventional methods. The substrate structure also improves the under-filling step following the IC connection in the packaging process, and solves the micro bump pitch IC packaging problem. The present invention applies small bump pad at original design bump layer, and provides more circuit routability and higher packaging density. Further more, it can reduce layer count, get higher yield rate, and provide a total solution to the next generation high density IC design.

The present invention will become more obvious from the following description when taken in connection with the accompanying drawings which show, for purposes of illustration only, a preferred embodiment in accordance with the present invention.

DETAILED DESCRIPTION OF THE INVENTION

Figure 1:
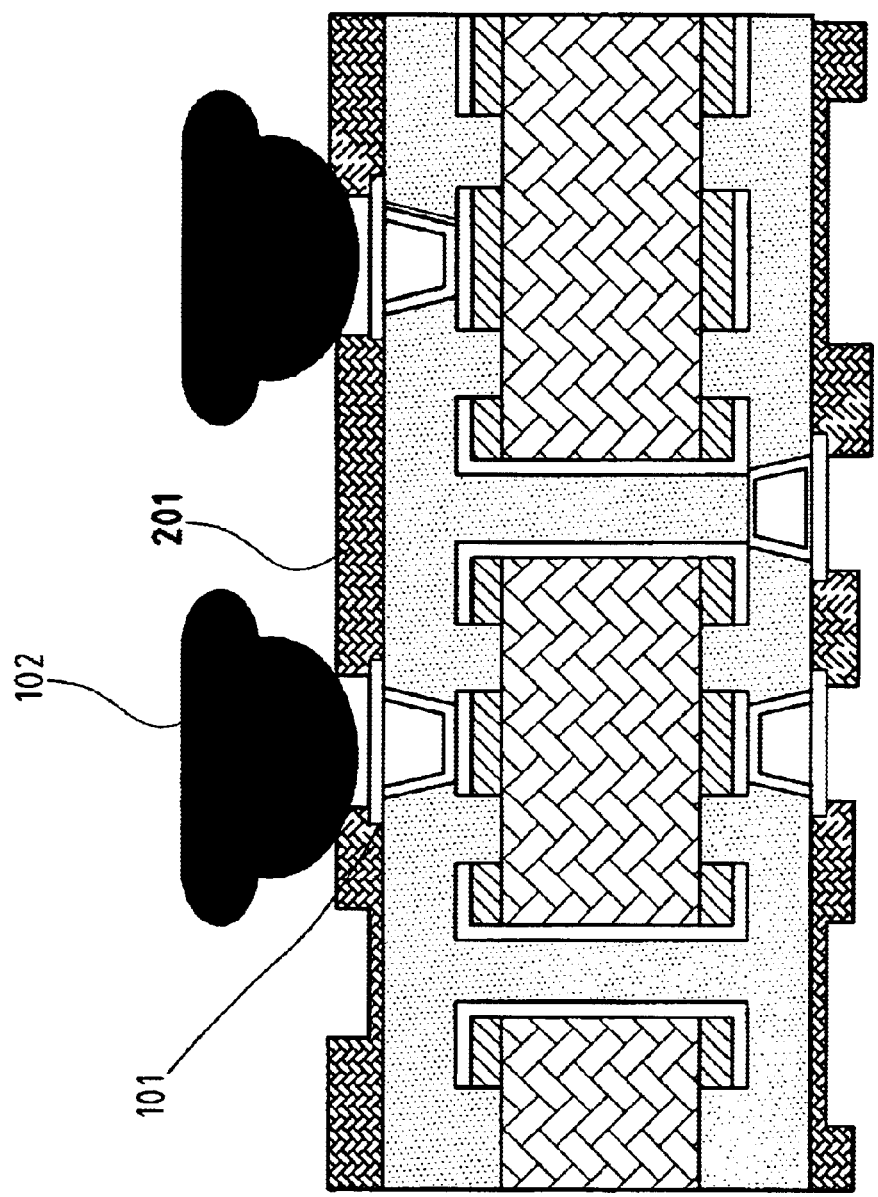
FIG. 1 shows the conventional method of solder resist defined bump pad lands.
Figure 2:
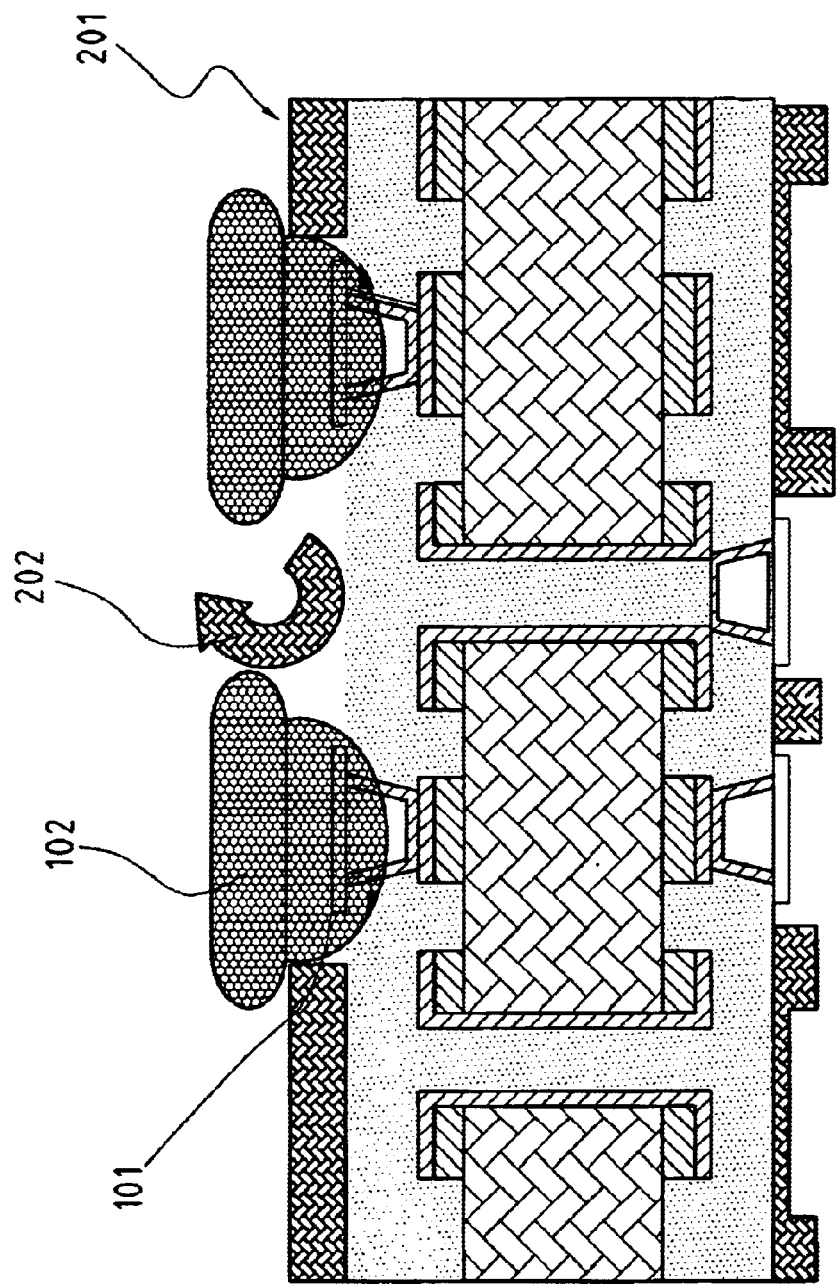
FIG. 2 shows the conventional method of metal defined bump pad lands.
Figure 3I:
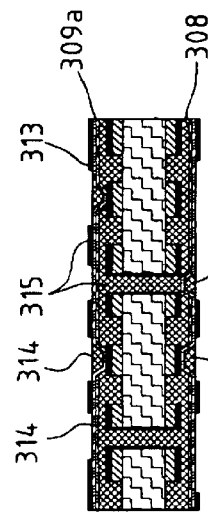
FIGS. 3A to 3V show a method of manufacturing micro bump pitch IC substrates, where the present invention is applicable.
Figure 3J:
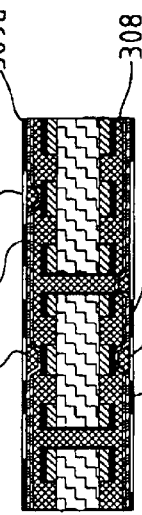
Figure 3K:
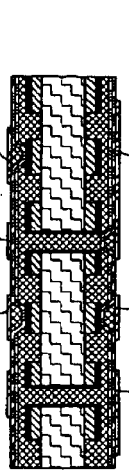
Figure 3L:
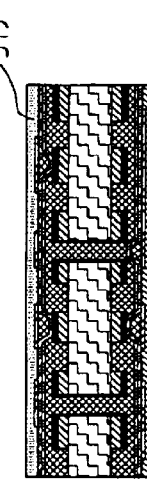
Figure 3M:
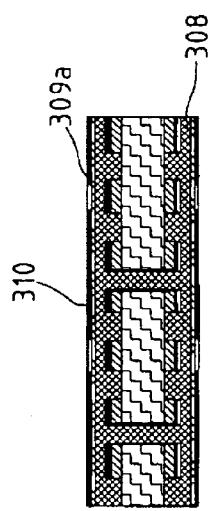
Figure 3N:
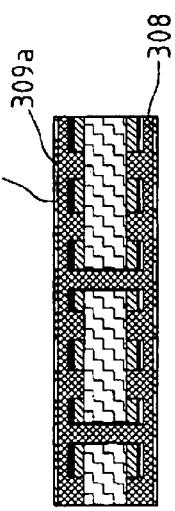
Figure 3O:
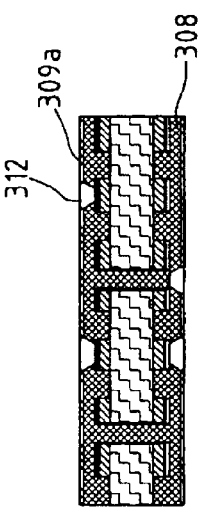
Figure 3P:
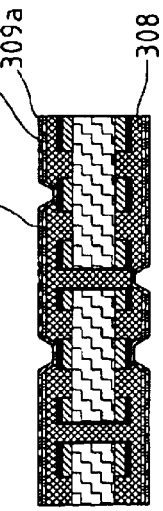
Figure 3T:
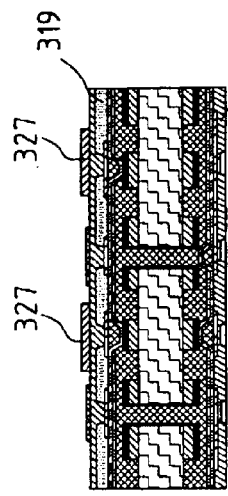
Figure 3U:
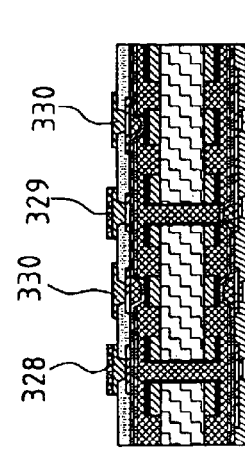
Figure 3V:
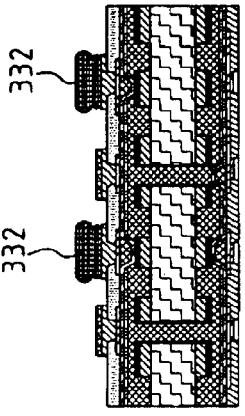

FIGS. 3A to 3V show the complete method of manufacturing Translation Pad for Micro bump pad pitch IC substrates, with feature steps of the present invention in FIGS. 3P to 3V.

FIGS. 3A to 3C show a process of providing a substrate. FIG. 3A shows a core 301 which may be a laminate made of Bismaleimide Triazine (BT), other organic material, or even ceramics. A first metal layer 302, which may be made of copper (Cu), is made on said substrate 301. FIG. 3B shows a plurality of through holes 303 drilled on said substrate 301. FIG. 3C shows that a first metal plated layer 304, which may be made of copper (Cu), is formed on said first metal layer 302 and said through holes 303.

FIGS. 3D to 3E show a step of forming an inner layer circuit. FIG. 3D uses a dry film 305 by image transfer pattern as the inner layer circuit. A part of said first metal plated layer 304 and a part of said first metal layer 302 are etched to form traces 306. As shown in FIG. 3E, the remained portions of said first metal plated layer 304 and said first metal layer 302 are left as the inner layer circuit 306.

FIG. 3F shows a step of black-oxidizing the inner layer circuit. A black oxide inner layer circuit 307 is formed in said inner layer circuit 306 by oxidizing the inner layer circuit 306.

FIGS. 3G to 3H show a step of forming a dielectric layer and a second metal layer. FIG. 3G shows using the dielectric material in the traces and the through holes of the substrate to form a dielectric layer 308. The dielectric layer 308 is made of Bismaleimide Triazing (BT) or other dielectric material. A metal foil 309, which may be made of copper (Cu), is laminated on said dielectric layer 308. FIG. 3G shows the metal foil thickness of said foil 309 is reduced, by chemical micro etching, to form the second metal layer 309a.

FIGS. 3I to 3L show a step of forming vias in the dielectric layer. FIG. 3I shows the dry film 310 used to form laser conformal mask 311, as shown in FIG. 3J. A plurality of micro vias 312 are drilled as shown in FIG. 3K. A second metal plated layer 313 is formed in said micro vias 312 and said second metal plated layer 313, as shown in FIG. 3L.

FIGS. 3M to 3O show a step of forming a circuit layer. FIG. 3M shows an image of photo resist 315 is used as a mask. Plating filled copper 314 is applied in said dielectric circuit second metal plated layer 313 and said vias 312 according to the area exposed by said photo resist mask 315. Then, a Ni/Au or Sn/Pb 316 is plated to act as an etching resist as FIG. 3N shows. FIG. 3O shows the stripping of said photo resist mask 315, using said Ni/Au or Sn/Pb 316 as an etching resist to etch on said second metal layer 309a wherein the remained portion is the circuit layer 317, including bump pads 318a, 318b, and 318c.

The aforementioned steps up to this point are steps used in related arts. The following are the steps proposed in the present invention. FIG. 3P shows a step of forming a layer of dielectric. A layer of dielectric 319 is formed on the bump pad side of the substrate to replace the solder resist used in conventional methods. A solder resist layer 320 is formed on the ball pad side of the substrate.

Figure 3Q:
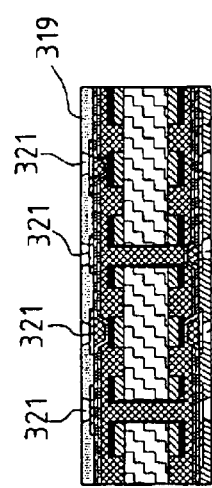
Figure 3R:
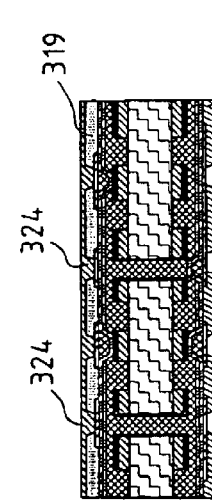

FIGS. 3Q to 3R show a step of forming a plurality of micro vias drilled by CCD alignment then laser ablation. Use CCD alignment laser to ablate a plurality of micro vias 321 on said dielectric layer 319, so that the bump pads, passive component pads and fiducial marks are open to the surface level. Then, use the conventional exposure printing method to form solder resist ball pads 322 on said solder resist 320, and electro-plate a thin metal conductive layer, as shown in FIG. 3Q. FIG. 3R shows the plating filled vias step. Use plating resist 323 to protect said ball pads from electro-plating, and the exposed bump pads are applied with a layer of plating filled metal 324 to fill up said micro vias.

Figure 3S:
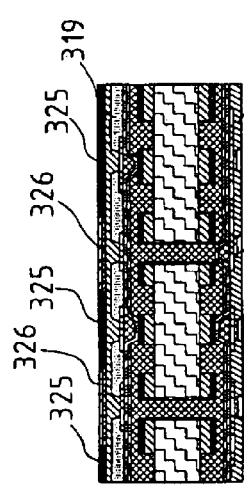

FIGS. 3S–3U shows a step enlarging the bump pads. Remove the electro-plating resist 323 protecting said ball pads to expose the ball pads. Apply photo plating resist 325 on bump pad side, and use the image as a mask. The exposed areas (such as passive component pads, fiducial marks) and exposed ball pads are applied with a layer of Ni/Au or Sn/Pb 326, as shown in FIG. 3S. FIG. 3T shows the stripping of the photo plating resist 325, applying photo etching resist 327. Use the image as a mask to cover the areas of the enlarged bump pads on said bump pad side metal layer 324. In FIG. 3U, Ni/Au or Sn/Pb, combined with etching resist mask 327, is used to form a layer of Ni/Au or Sn/Pb on passive component pads 328, fiducial marks 329, and flexible adjust bump pads 330 to match wafer side bump size on said dielectric layer 319 and ball pads 331 in the etching process.

FIG. 3V shows the step of applying eutectic solder paste, or the environmentally friendly lead-free solder onto said enlarged bump pads, and flattening said bump pads 332.

The present invention has the following advantages in comparison with the current technologies:

1. The use of a dielectric layer to replace solder resist. Because said dielectric layer has the same coefficient of thermal expansion as the substrate, it solves the problem of substrate warpage or twist due to the heat expansion during the process. Furthermore, the failure rate of the packaging reliability testing is reduced because of the homogeneity of material, and said material has better physical characteristics, such as water absorption, than solder resist. Therefore, the packaging reliability is improved.
2. The step of using plating filled vias solves the problem of insufficient bonding strength due to the under-sized bump pads.
3. By using etching on the dielectric layer, it does not only expose a larger area of said bump pad, but also raise the passive component pads and fiducial marks to the surface level of said dielectric layer. This solves the problems of bump pads being buried in the solder resist, or solder grain size too large for stencil print soldering that are associated with conventional methods.
4. By enlarging bump pads and providing higher flexibility, the final surface finishing (e.g., electroplating Ni/Au, Sn/Pb Paste, lead-free material or organic solderability coating) can provide more IC connecting methods, such as, IC Gold Stub/Tin Stub connection, and gold wiring. If solder paste, or lead-free solder paste, is applied to make the Sn/Pb solder bump, and the bumps are flattened, the flip chip packaging methods can also be used.
5. The present invention can also be used to improve the routing density in conventional flip chip packaging methods. For example, when said conventional flip chip substrate uses a 250 um IC design, conventional methods require at least the bump pads with the size of 150 um in diameter. With present invention, the size of the bump pads can be reduced to below 80 um. The saved 70 um can be used to increase the routing density, and further reduce the substrate's 6- to 10-layer structure to a 4- to 8-layer structure. This will further reduce the manufacturing cost.

While we have shown and described the embodiment in accordance with the present invention, it should be clear to those skilled in the art that further embodiments may be made without departing from the scope of the present invention.

What is claimed is:

1. A method for improving an IC substrate manufacturing process with bump pitch less than 180 um, comprising the steps of:

(a) providing a substrate formed with a first metal layer and a plurality of through holes, said first metal layer and said plurality of through holes being plated with a first metal plated layer;

(b) forming an inner layer circuit by patterning and etching said first metal layer and said first metal plated layer;

(c) black-oxiding said inner layer circuit;

(d) covering and filling said inner layer circuit and said plurality of through holes with a first dielectric layer;

(e) covering said first dielectric layer with a second metal layer;

(f) forming a plurality of first micro vias through said second metal layer and said first dielectric layer;

(g) plating said second metal layer and said plurality of first micro vias with a second metal plated layer;

(h) filling said plurality of first micro vias with plating filled copper, etching and forming a circuit layer above said plurality of first micro vias and said second metal plated layer, said circuit layer including a plurality of bump pads on a bump-pad side of said substrate and a plurality of ball pads on a ball-pad side of said substrate;

(i) forming a second dielectric layer on said bump-pad side for covering said plurality of bump pads, and a solder resist layer on said ball-pad side for covering said plurality of ball pads;

(j) forming a plurality of second micro vias by CCD alignment laser drilling on said second dielectric layer for exposing said plurality of bump pads;

(k) filling up said plurality of second micro vias with plating filled metal to a surface level for providing enlarged bump pads and translating passive components and fiducial marks to said surface level;

(l) providing flexible and adjustable bump pads to meet wafer side bump size; and (m) providing flexible final finishing.

2. The method as claimed in claim 1, wherein said bump pads are enlarged by using photo etching resist as a mask and electro-plating Ni/Au or Sn/Pb on said second dielectric layer, and said enlarged bump pads are applied with solder paste or electro-plating Sn/Pb reflow and then flattened for wafer side bump connection.

3. The method as claimed in claim 1, wherein said bump pads have a bump pitch less than 150 um.

4. The method as claimed in claim 1, wherein said solder resist layer includes solder resist with a width less than 75 um.

* * * * *